United States Patent [19]

Hermens et al.

[11] Patent Number: 5,798,811
[45] Date of Patent: Aug. 25, 1998

[54] PICTURE DISPLAY DEVICE WITH PARTIALLY CLEAR CONTACT AREAS

[75] Inventors: Hendrik C. M. Hermens; Lucas A. G. Jacobs; Henrikus C. M. P. Driessen; Cornelis H. T. Van Der Horst, all of Heerlen; Hubertus E. A. Schäfer, Eindhoven, all of Netherlands

[73] Assignee: U.S. Philips Corporation, New York, N.Y.

[21] Appl. No.: 361,088

[22] Filed: Dec. 21, 1994

[30] Foreign Application Priority Data

Dec. 21, 1993 [EP] European Pat. Off. ............ 93203716

[51] Int. Cl.$^6$ .................................................. G02F 1/1345
[52] U.S. Cl. ................................................ 349/152; 349/149
[58] Field of Search .............................. 359/88; 349/149, 349/152

[56] References Cited

U.S. PATENT DOCUMENTS

| | | | |
|---|---|---|---|
| 4,326,929 | 4/1982 | Minezaki et al. | 204/15 |
| 5,000,545 | 3/1991 | Yoshioka et al. | 350/336 |
| 5,067,796 | 11/1991 | Suzuki et al. | 359/88 |
| 5,270,848 | 12/1993 | Takabayashi et al. | 359/88 |
| 5,384,154 | 1/1995 | De Bakker et al. | 427/123 |
| 5,499,131 | 3/1996 | Kim | 359/88 |

FOREIGN PATENT DOCUMENTS

| | | | |
|---|---|---|---|
| 2939963 | 4/1980 | Germany | G09F 9/30 |
| 3409420 | 9/1985 | Germany | G09F 9/30 |
| 59-129833 | 7/1984 | Japan | 359/88 |

*Primary Examiner*—William L. Sikes
*Assistant Examiner*—Charles Miller
*Attorney, Agent, or Firm*—John C. Fox

[57] ABSTRACT

The external connections of an electro-optical display device are connected to a semiconductor driving device (13) by respective contact faces (12) of transparent conductor tracks (11). The conductor tracks (11) are provided with a metallic top coating (17) which extends to the proximity of the associated contact face (12). To suppress resistance variations in the conductor tracks with respect to each other and from device to device, the metallic top coating (17) continues in the direction of the contact face (12) in a form of, for example, a relatively narrow metal track (18) which extends across the contact face (12) but covers only a part thereof.

9 Claims, 3 Drawing Sheets

PICTURE DISPLAY DEVICE WITH PARTIALLY CLEAR CONTACT AREAS

BACKGROUND OF THE INVENTION

The invention relates to a picture display device comprising two supporting plates which enclose an electro-optical layer, a first supporting plate being provided with a plurality of at least substantially transparent picture electrodes and the facing supporting plate comprising at least one counter electrode, the first supporting plate having at least substantially transparent conductor tracks which are connected to respective contact faces on which a semiconductor driving device is arranged, a first set of the transparent conductor tracks comprising the picture electrodes.

The invention also relates to a method of manufacturing a picture display device, in which method an at least substantially transparent conducting layer is provided on a supporting plate, the conducting layer is provided with an etching mask and a plurality of picture electrodes and conductor tracks is etched from the conducting layer while masking the etching mask.

A known picture display device of the type described in the opening paragraph comprises two transparent, parallel supporting plates of glass enclosing an electro-optical layer of a liquid crystalline material. A first one of the two supporting plates is provided with a plurality of substantially transparent picture electrodes which are connected via substantially transparent conductor tracks to respective contact faces which are formed by the relatively narrow ends of the conductor tracks. The facing supporting plate is provided with a counter electrode which is also transparent. A semiconductor driving device is arranged on the contact faces, which device is provided with a corresponding number of contact faces which are connected in an electrically conducting manner to the contact faces of the picture display device by means of conducting bumps. The picture electrodes are driven by means of the driving device.

In the known device, indium-tin oxide is used for the electrodes and conductor tracks. Although indium-tin oxide is an electrical conductor, this material, likewise as other transparent conducting materials such as, for example tin oxide doped or not doped with antimony, has a considerably higher specific resistance than most metals and other metallic materials. Notably in advanced picture display devices using a Super Twist Nematic (STN) liquid crystalline layer as an electro-optical layer, in which the thickness of the picture electrodes is preferably kept relatively thin, the use of a transparent conductor material for the conductor tracks leads to a considerable resistance per square.

This drawback does not only apply to the picture electrodes but also, if not even more, to electrodes located outside the actual image plane and used for driving the semiconductor driving device, which electrodes are generally provided simultaneously to facilitate simpler processing.

To decrease the total resistance, notably of the narrow ends of the conductor tracks, the conductor tracks are therefore coated outside the sealing edge with a metallic top coating of nickel or chromium which reduces the resistance per square of the conductor tracks by an order of magnitude already at a comparatively small thickness. The metallic top coating is then provided as far as the contact faces but leaves the contact faces completely clear in order that the conductor bumps directly contact the transparent conductor material, i.e. without the interposition of the nickel top coating. It appears that it is not (very well) possible to realise a satisfactory and reliable contact of the conductor bumps with the material of the top coating when using conventional connection techniques such as, for example thermocompression, gluing and soldering, whereas such a contact with the subjacent transparent conductor material readily is obtained. This is presumably due to a thin oxide layer which forms on the metallic top coating and insulates the conductor bump effectively from the conductor track. Such an insulating oxide layer is not formed on the subjacent transparent conductor material.

Although the series resistance of the conductor tracks is thus considerably reduced and satisfactory interconnections between the driving device and external connections and between the driving device and the picture display device can be established, the known device nevertheless appears to operate unsatisfactorily in practice.

This becomes notably manifest when the semiconductor driving device comprises a plurality of ICs. Contacting may then differ considerably from IC to IC, and notably the resistance differences at the inputs (and, for example the supply contacts) lead to variations of the output voltages, hence to variations of the voltages at the picture electrodes. As these voltages then differ from IC to IC, blocks of lines are provided with different drive voltages, referred to as block errors.

Moreover, the manufacture of the known device appears to be not very reproducible and thus leads to an inadmissibly large number of rejects.

OBJECTS AND SUMMARY OF THE INVENTION

It is, inter alia an object of the present invention to provide a picture display device and a method of manufacturing a picture display device of the type described in the opening paragraph in which these drawbacks are obviated or at least considerably mitigated.

According to the invention, a picture display device of the type described in the opening paragraph is therefore characterized in that at least a part of a second set of the transparent conductor tracks is provided at least at their end with a metallic top coating which leaves the contact face associated with the end at least partially clear. Preferably, also the first set of transparent conductors is provided with such a metallic top coating.

The invention is based, inter alia on the recognition that the unsatisfactory operation and poor reproducibility of the known device lead to considerably varying drive voltages, notably at the input side and other drive connections, hence to varying drive voltages of the picture electrodes. In the known device, the drive voltages are not only different from picture electrode to picture electrode, but particularly from group to group due to picture electrodes which are driven by different ICs (block errors) and, moreover, from picture display device to picture display device. The inventors have recognized that such voltage variations result from resistance variations in the conductor tracks due to (inevitable) positioning errors of the semiconductor driving device with respect to the metallic top coating.

Due to such positioning errors, the distance between a conductor bump and the beginning (or the end) of the metallic top layer in one conductor track may be larger or smaller than in the other conductor track, and moreover, this distance may vary from picture display device to picture display device. Due to the considerably larger resistance per square of the uncoated part of a conductor track with respect to the part coated with the metallic top coating, such differences in distance between the conductor bump and the beginning of the metallic top coating lead to considerable resistance variations, notably in the often relatively narrow ends of the conductor tracks and to accompanying variations in the voltages at the drive and control inputs of the ICs associated with the driving device.

In the device according to the invention, such resistance variations are largely reduced because the metallic top coating does not end in front of a contact face but also extends across the contact face. To compensate for resistance variations due to positioning tolerances in the direction of the metal track, a preferred embodiment is characterized in that the metallic contact coating continues towards a contact face in the form of a relatively narrow metal track. According to the invention, the metal track covers a contact face only partially, but already at a small width a metal track leads to a considerable reduction of the resistance per square so that mutual differences in resistance between conductor tracks are considerably smaller. On the other hand, at the area of the contact face the surface of the transparent conductor material remains uncoated so as to ensure a satisfactory and reliable electrical contact with a conductor bump. The invention thus yields a considerably better effect and a greater reproducibility of a device of the type described in the opening paragraph. Similar advantages are obtained if the electrodes which form part of the picture electrodes are provided with a metallic contact coating.

In a special embodiment of the picture display device according to the invention the metal track is formed in that the metallic top coating is constricted at the area of the contact face to only a part of its width, more particularly to less than half of its width. In the latter case more than half the surface area of a contact face remains available for realising a satisfactory electrical contact with a conductor bump. Since the metal track is thus a continuation of the metallic top coating, the metal track can be provided in the same deposition step as the other part of the metallic top coating.

According to the invention, a method of manufacturing a picture display device of the type described in the opening paragraph is therefore characterized in that a deposition mask is arranged on the conductor tracks and picture electrodes, which mask leaves clear a comb-shaped pattern having teeth which are narrower than the conductor tracks, at least one of the teeth extending at the location of an end of a conductor track and an associated contact face, and in that metal is selectively deposited on the conductor track while masking the deposition mask. At the location of the at least one tooth, the metal track is thus formed which is contiguous with the other part of the metallic top coating thus deposited on the conductor tracks, which is formed at the area of the basic portion of the comb-shaped pattern. For such a selective deposition use may be made of, for example electrodeposition in which metal is selectively deposited on the conductor tracks but not in between these tracks.

In this method the deposition mask is to be aligned with respect to the conductor tracks which have meanwhile been formed. To enhance the aligning tolerances to be taken into account, a particular embodiment of the method according to the invention is characterized in that such a deposition mask is used that it leaves clear a comb-shaped pattern having at least substantially equidistant teeth which are positioned at a mutual pitch which is at most and preferably at least substantially equal to the width of a conductor track at the location of an aperture. In that case, the deposition of the metal track is insensitive to a displacement of the deposition mask in a direction transverse to the conductor track, because at least one tooth of the comb-shaped pattern will always be positioned on a conductor track when using such a deposition mask.

Moreover, the use of a selective deposition technique always leads to metal being deposited at least substantially exclusively on the conductor tracks so that also in this connection the alignment of the deposition mask is not very critical.

In a further embodiment of the method according to the invention, a mutual distance which is larger than half the width of the conductor track is maintained in the deposition mask between the teeth of the comb-shaped pattern. In that case, the conductor track at the area of the metal track will remain free from metal across half its width or more so that a sufficiently free contact surface remains to ensure a satisfactory, reliable contact with a conductor bump of a semiconductor driving device arranged thereon.

In a preferred embodiment of the method according to the invention the etching mask is formed by locally exposing and subsequently developing a positive photoresist layer, i.e. a photoresist whose exposed parts are removed by developing. The deposition mask can then be simply formed by locally exposing the etching mask after the picture electrodes and the conductor tracks have been etched, while the desired pattern of the deposition mask is imaged in the etching mask, and by subsequent developing.

In the method according to the invention, the conductor tracks can be metallized.

BRIEF DESCRIPTION OF THE DRAWINGS

These and other aspects of the invention will be apparent from and elucidated with reference to the embodiments described hereinafter.

In the drawings

DESCRIPTION OF PREFERRED EMBODIMENTS

Figure 1:
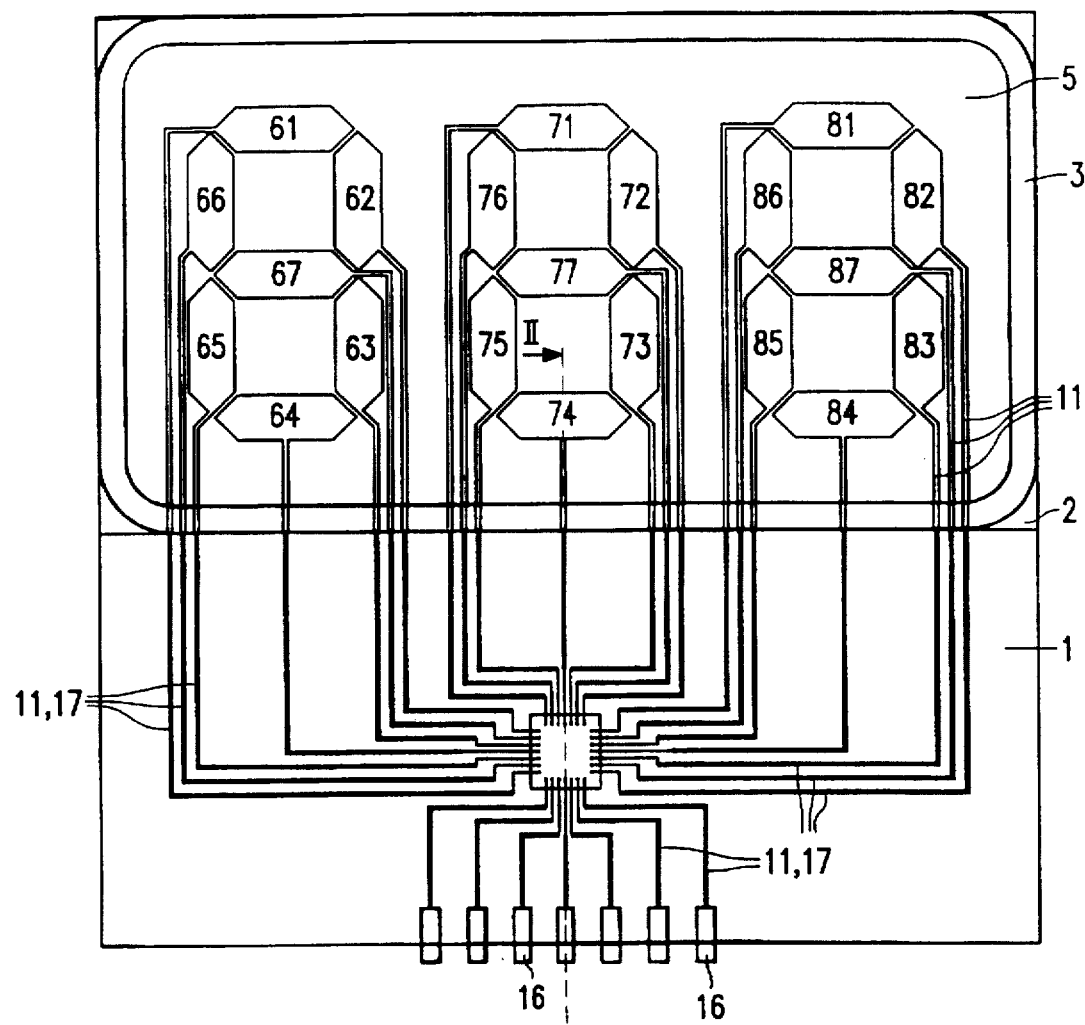
FIG. 1 is a plan view of a picture display device according to the invention.

The Figures are diagrammatic and not to scale. For the sake of clarity, some dimensions are shown in an exaggerated form. Corresponding components in the Figures have the same reference numerals as much as possible.

Figure 2:
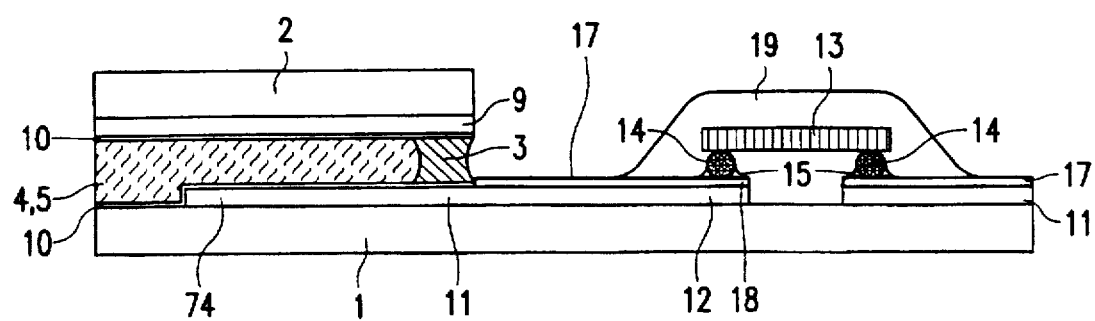
FIG. 2 is a cross-sectional view taken on the line II—II of the picture display device in FIG. 1.

The picture display device shown in FIGS. 1 and 2 comprises two transparent supporting plates 1, 2 of glass which are interconnected by means of a sealing edge 3 while forming a gap 4 in which an electro-optical layer 5 of a liquid crystalline material is enclosed. A first one of the two supporting plates 1 is provided at its side facing the liquid 5 with a plurality of at least substantially transparent picture electrodes 61–67, 71–77, 81–87, 91–97 of indium-tin oxide (ITO) which are located in groups and can generate, per group, a given set of characters. A transparent electrode 9 of indium-tin oxide constituting a counter electrode is arranged on the opposite supporting plate 2. The various ITO electrodes 61–67, 71–77, 81–87 are coated with a passivation layer and a separate or inseparate orientation layer 10, in this example of a suitable polyimide.

The picture electrodes 61–67, 71–77, 81–87 are individually connected to respective contact faces 12 by means of substantially transparent conductor tracks 11. The contact faces are formed by the approximately 100 µm wide ends of the conductor tracks 11. A semiconductor driving device 13 is provided on the contact faces 12, which device has corresponding contact faces (not shown) which are electrically connected to the contact faces 12 of the conductor tracks 11 via conductor bumps 14. The conductor bumps 14 comprise gold and are secured to the contact faces 12 by means of an adhesive layer 15. The picture electrodes 61–67, 71–77, 81–87 can be driven as desired by means of the semiconductor driving device 13. Via a plurality of external connections 16, the required power supply voltages and input signals can be applied to the driving device 13. The driving device 13 is moulded in a suitable synthetic material 19 so as to protect it from mechanical and chemical influences.

To reduce the series resistance of the conductor tracks 11, the conductor tracks 11, and notably their relatively narrow ends, are coated with an approximately 300 nm thick metallic top coating 17 of nickel outside the sealing edge 3, i.e. outside the image plane of the device. This top coating 17 has a resistance per square of approximately 10 Ω/□ which is considerably lower than the subjacent, approximately 2500 nm thick conductor track 11 of indium-tin oxide whose resistance per square is approximately 250 Ω/□. A drawback of such a top coating 17 is, however, that it appears to be difficult to realise a satisfactory and reliable electrical contact with a conductor bump 14, using conventional connection techniques such as gluing, soldering or thermocompression, which electrical contact can be realised satisfactorily on the subjacent conductor track 11. According to the invention, a conductor track 11 is therefore only entirely coated with the nickel top coating 17 up to the proximity of a contact face 12 and in this example the top coating 17 is constricted to a part of its original width at least at the area of the contact face 12. The top coating 17 continues in the direction of the contact face 12 in the form of an approximately 25 µm narrow metal track 18 which extends midway across the contact face 12. This is shown in detail in FIG. 3a.

The metal track 18 covers the contact face 12 and the preceding part of the conductor track 11 only partially, but a considerable reduction of the resistance per square of the conductor track 11 is realised already at a small width. Notably resistance variations between conductor tracks and variations from picture display device to picture display device due to positioning errors of the driving device 13 are reduced thereby. For further clarification, FIG. 3b shows the configuration of 3a without the metal track 18.

Figure 3A:
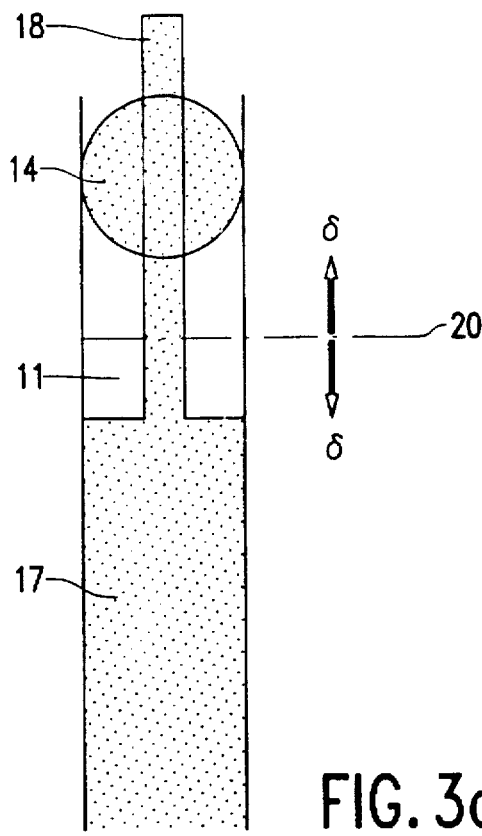
FIG. 3a is a detailed view of an end of a conductor track of FIG. 1, provided with a metal track according to the invention.

The positioning tolerance δ of the driving device and the metallic top coating 17 with respect to each other is approximately 50 µm, so that the nominal position of the conductor bump 14 is spaced apart from the metallic top coating 17 by approximately 50 µm, which is shown by means of the line 20. If due to positioning and alignment errors the metal coating 17 and the conductor bump 14 have both moved towards each other by 50 µm, they will touch each other and the resistance of the conductor track 11 in the case of both FIG. 3a and FIG. 3b is mainly determined by the resistance of the metallic top coating, i.e. the nickel coating having a resistance per square of approximately 10 Ω/□. Over a distance of 100 µm, this resistance in the approximately 100 µm wide end of the conductor track is:

$$R = \frac{100 \, \mu m \times 10 \Omega/\square}{100 \, \mu m} = 10 \, \Omega$$

Figure 3B:
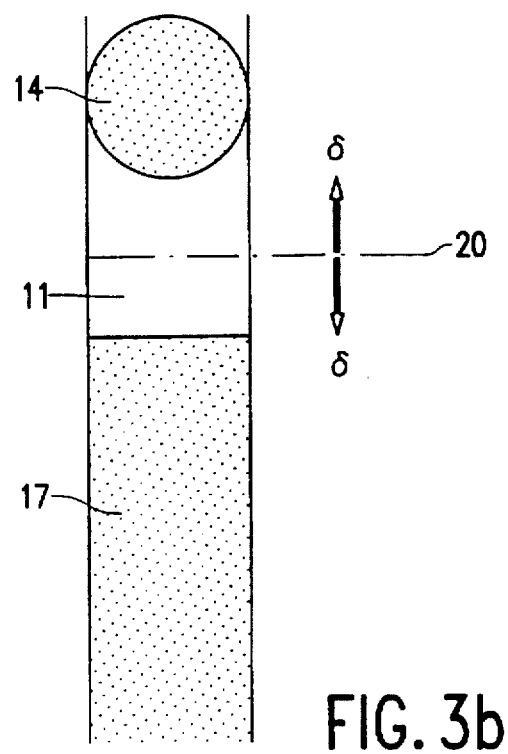
FIG. 3b is a detailed view of an end of a conductor track without a metal track.

In the other extreme case, in which the conductor bump 14 and the metallic top coating 17 are both spaced apart by 50 µm, the resistance is entirely determined by the indium-tin oxide of the conductor track 11 as regards the first 100 µm in the situation shown in FIG. 3b. At a resistance per square of 250 Ω/□, this yields a total resistance R of:

$$R = \frac{100 \, \mu m \times 250 \, \Omega/\square}{100 \, \mu m} = 250 \, \Omega$$

This means that in the situation of FIG. 3b the resistance may vary from conductor track to conductor track and from device to device by a factor of 25, which in relevant cases leads to unacceptable variations of the drive voltages of the picture electrodes.

Figure 3C:
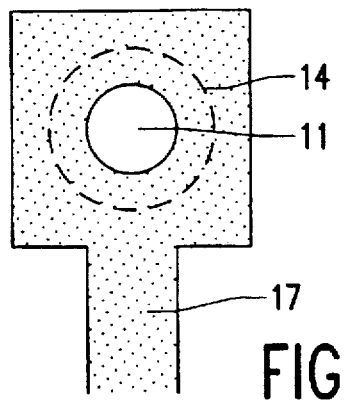
FIGS. 3c–3e show variants of FIG. 3a, and FIGS. 4–6 are plan views of a picture display device in successive stages of manufacture according to the invention.
Figure 3D:
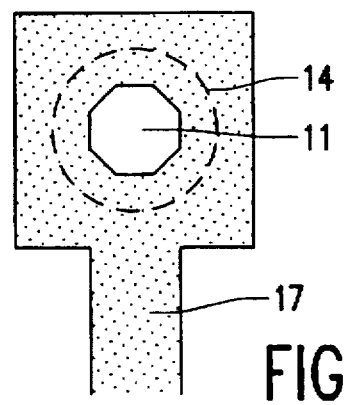
Figure 3E:
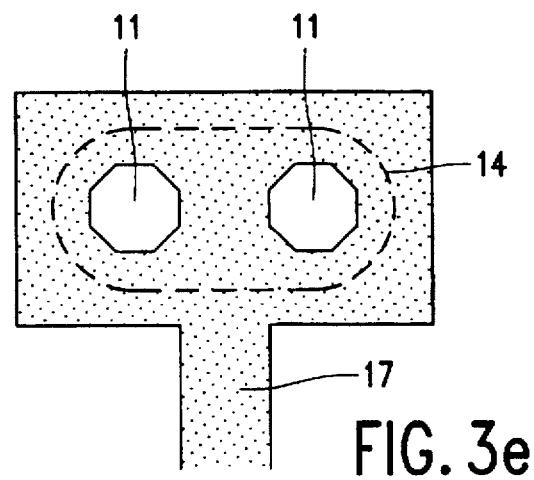

However, if according to the invention the metallic top coating does not end in front of the contact face but continues in the form of a metal track across the contact face, the resistance in the first 100 µm of the conductor track is considerably reduced to a value of:

$$R = \frac{100 \, \mu m \times 10 \, \Omega/\square}{25 \, \mu m} = 40 \, \Omega$$

at a relatively narrow nickel track of only approximately 25 µm wide as is shown in FIG. 3a. This means that the resistance of a conductor track 11 may only deviate by a factor of 4 due to positioning and alignment errors from the resistance of another conductor track, with which such resistance variations have been reduced by more than a factor of six as compared with the situation of FIG. 3b. By widening the metal track 18, a further reduction can be achieved, be it that always a sufficient quantity of free ITO surface of the conductor track 11 must remain to realise a satisfactory electrical contact with the conductor bump 14. A satisfactory contact is possible in the relevant case as long as half or more of the contact face 12 is free. This means that, starting from a 50 µm wide nickel track, possible resistance variations in the conductor tracks can be reduced by more than a factor of 12 as compared with the situation shown in FIG. 3b. Moreover, the resistance variations may be reduced by starting from a thicker metal track so that its resistance per square will decrease, or, notably when more surface area is required for the bump, by widening the conductor track at the area of the contact face, as is shown in FIG. 3c. FIG. 3d shows an example in which strip-shaped projections (which, if necessary, may extend throughout the width of the aperture) reduce voltage variations due to positioning tolerances transverse to the direction of the electrodes. FIG. 3e shows a further variant of FIG. 3a.

Figure 4:
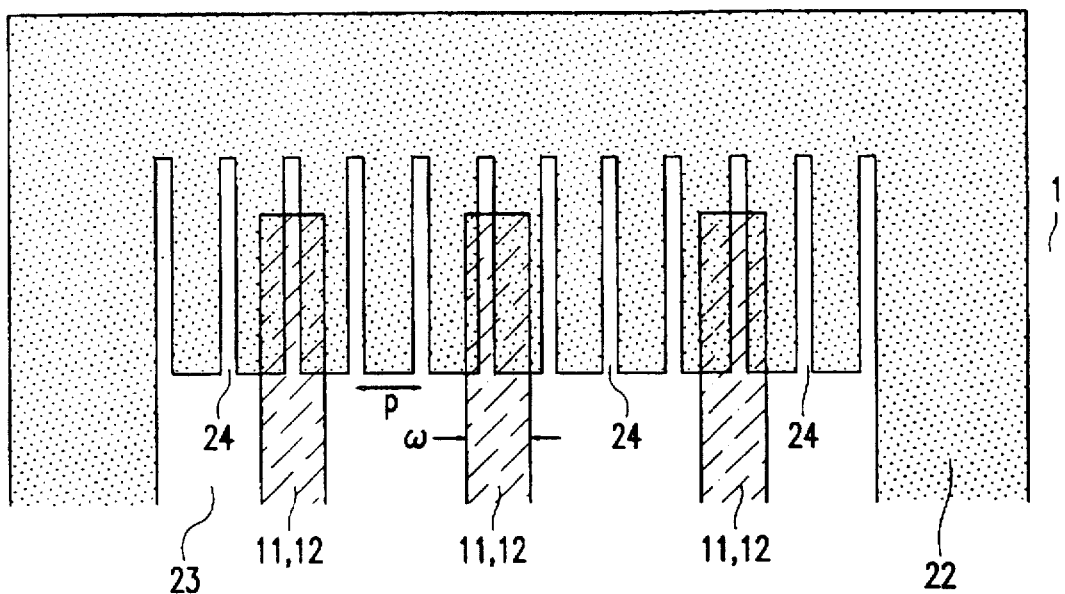

To manufacture the picture display device, an approximately 2500 nm thick layer of indium-tin oxide is provided on a glass plate and subsequently coated with a layer of positive photoresist. By exposing the photoresist layer via a photolithographic mask and developing it, while the exposed parts of the photoresist layer are dissolved, an etching mask is formed therefrom with which the ITO layer is etched in a pattern while masking the etching mask and the picture electrodes 61–67, 71–77, 81–87 and conductor tracks 11 are formed, see FIG. 4.

According to the invention, a deposition mask is subsequently provided on the conductor track, which mask leaves clear a comb-shaped pattern 23 having teeth 24 which are narrower than the conductor tracks 11, at least one of which teeth extends across the end of a conductor track 11 and the associated contact face 12. Such a deposition mask is formed by exposing the etching mask 21 of still unexposed positive photoresist via a photolithographic mask 22 in a pattern which is the complement of the desired deposition mask, see FIG. 4. This photomask 22 leaves clear a comb-shaped pattern 23 having substantially equidistant teeth 24 spaced apart by a regular pitch p. The pitch p in this example is equal to the width w of the conductor tracks 11 so that always at least one of the teeth 24 of the pattern 23 will be positioned on a conductor track 11. Thus, the method is insensitive to lateral alignment errors of the mask 22, also when the pitch p is chosen to be smaller than the width w.

Figure 5:
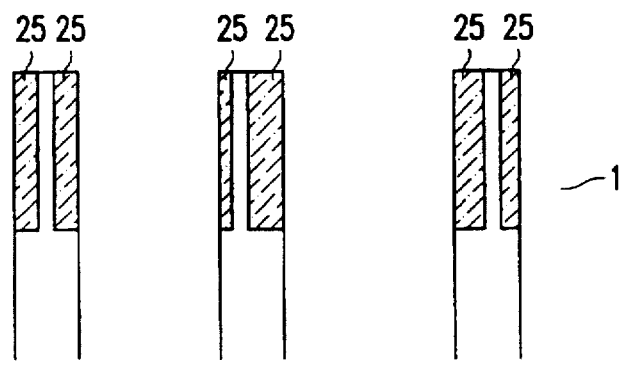

While masking the photomask 22, the etching mask 21 is exposed in a pattern which is complementary to the pattern of the ultimate deposition mask 24. By subsequently developing the etching mask, in which the exposed parts are dissolved, the desired deposition mask 25 is thus obtained, see FIG. 5. This mask leaves clear the comb-shaped pattern 23 which is defined by the photomask 22.

Figure 6:
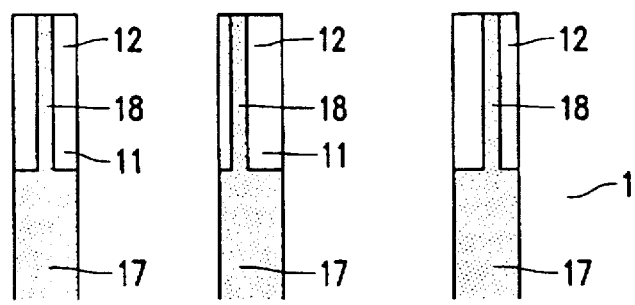

Subsequently the assembly is introduced into an electroless nickel-plating bath with which nickel is selectively deposited on the free indium-tin oxide of the conductor tracks 11. There is no nickel deposition of any significance between the conductor tracks 11 or at the area of the deposition mask 25. The deposition mask is subsequently removed so that the structure of FIG. 6 is obtained, with conductor tracks 11 coated at least at their ends with an approximately 300 nm thick top coating of nickel, the nickel coating 17 narrowing at the area of contact faces 12 associated with the conductor tracks 11 to metal tracks 18 having a width of approximately 25 μm extending across the contact faces 12.

At the area of the image plane, a passivation layer and a separate or inseparate orientation layer are provided on the picture electrodes, whereafter the glass plate is composed in a conventional manner with a second glass plate to form a cell which is filled with liquid crystalline material. The cell is subsequently finished in the conventional manner, with, inter alia a semiconductor driving device being positioned on the contact faces of the conductor tracks and the device being provided with a power supply and a suitable housing.

Although the invention is described with reference to some embodiments, it will be evident that the invention is by no means limited to the embodiments described. Many variations and forms are possible within the scope of the invention. For example, in the method described the metallic top coating may also be provided after the glass plates have been formed to a cell. However, it is preferred to metallize the conductor tracks on a substantially flat supporting plate, as in the embodiment shown, because it is thereby avoided that metal residues are left, notably at the sealing edge, which might otherwise cause a short circuit.

Moreover, the use of a metallic top coating is not limited to nickel, but also other metals or metal-like materials may be used within the scope of the invention, such as, for example chromium, molybdenum and tantalum or metal alloys and metal compounds. Furthermore, selective deposition techniques other than electroless deposition may be used such as, for example other forms of electrodeposition in which the conductive power of the conductor tracks on which metal is to be deposited can always be used to advantage.

For the material of the conductor tracks another transparent conductor may be used instead of ITO, such as doped or non-doped tin oxide. The same applies to the counter electrode which may also be divided into a number of separate counter electrodes which can be driven individually so as to limit the total number of conductor tracks of the device, which is usually referred to as multiplexing.

The invention is neither limited to real liquid crystal picture display devices, but may be used to advantage in all flat-panel picture display devices in which a semiconductor driving device is integrated on a substrate together with the display panel. In addition to real liquid crystal picture display devices, the invention is also advantageously applicable, for example in PDLC (Polymer Dispersed Liquid Crystal) devices in which liquid crystalline material is dispersed in a polymer, as well as for plasma and other flat-panel fluorescence picture display devices. Moreover, the invention may not only be used for passive devices, in which the picture electrodes are directly driven by the driving device, but also for active devices in which the picture electrode is driven via a matrix of active (semiconductor) switching elements.

Generally, the invention provides a picture display device in which drive circuits and picture electrodes are driven via partly metallized, substantially transparent conductor tracks, in which resistance variations in the conductor tracks and the accompanying voltage variations on the picture electrodes are effectively reduced. The invention thus leads to a higher reproducibility and a lower number of rejects of the device. Moreover, the invention provides a very practical method of manufacturing such a device, in which the deposition mask required for metallizing conductor tracks need not be aligned very critically.

We claim:

1. A picture display device comprising two supporting plates which enclose an electro-optical layer, a first supporting plate being provided with a plurality of at least substantially transparent picture electrodes and the facing supporting plate comprising at least one counterelectrode, the first supporting plate also being provided with a semiconductor driving device and a first set of at least substantially transparent conductor tracks leading from the picture electrodes to the semiconductor driving device, each track of the first set of tracks terminating in a contact face which is connected to the semiconductor driving device, the first supporting plate also being provided with a plurality of external connections and a second set of transparent conductor tracks leading from these connections to the semiconductor driving device, each track of the second set of tracks terminating in a contact face which is connected to the semiconductor driving device, characterized in that a metallic top coating is provided on at least a part of the second set of conductor tracks, which coating is provided on only a portion of the contact face associated with the track, leaving the remaining portion of the contact face free of the coating.

2. A picture display device as claimed in claim 1, characterized in that the electro-optical layer comprises a liquid crystalline material and the metallic top coating comprises nickel or chromium.

3. A picture display device as claimed in claim 1, characterized in that the metallic top coating leaves clear a circular or polygonal surface area of the contact face.

4. A picture display device as claimed in claim 3, characterized in that the metallic top coating comprises a narrow metal track which extends across the contact.

5. A picture display device as claimed in claim 4, characterized in that the metallic top coating is constricted proximate to a contact face to a metal track of a part of its width.

6. A picture display device as claimed in claim 5, characterized in that the metallic top coating is constricted proximate to a contact face to less than half of its width.

7. A picture display device as claimed in claim 1, characterized in that a metallic top coating is provided on the first set of conductor tracks, which coating is provided on only a portion of the contact face associated with the track, leaving the remaining portion of the contact face free of the coating.

8. A picture display device as claimed in claim 7, characterized in that the metallic top coating leaves clear a circular or polygonal surface area of the contact face.

9. A picture display device as claimed in claim 1, characterized in that the metallic top coating comprises a metal track which extends across the contact face but covers only a part thereof.

* * * * *